United States Patent

Oostra et al.

Patent Number: 5,354,697
Date of Patent: Oct. 11, 1994

[54] IMPLANTATION METHOD HAVING IMPROVED MATERIAL PURITY

[75] Inventors: Doeke J. Oostra, Eindhoven; Gerardus J. L. Ouwerling, Rijswijk; Jozef J. M. Ottenheim, Roosendaal; Johanna M. L. Van Rooij-Mulder, Eindhoven, all of Netherlands

[73] Assignee: U.S. Philips Corporation, New York, N.Y.

[21] Appl. No.: 949,277

[22] Filed: Sep. 22, 1992

[30] Foreign Application Priority Data

Sep. 23, 1991 [EP] European Pat. Off. ......... 91202455

[51] Int. Cl.$^5$ ............................................. H01L 21/265
[52] U.S. Cl. ........................................ 437/20; 437/30; 437/36; 437/944
[58] Field of Search .................. 437/30, 36, 944, 20; 148/DIG. 100

[56] References Cited

U.S. PATENT DOCUMENTS

| | | | |
|---|---|---|---|
| 4,084,987 | 4/1978 | Godber | 437/36 |
| 4,755,477 | 7/1988 | Chao | 437/36 |
| 5,093,280 | 3/1991 | Tully | 437/944 |
| 5,132,241 | 7/1992 | Su | 437/36 |

FOREIGN PATENT DOCUMENTS

| | | | |
|---|---|---|---|
| 59-57479 | 4/1984 | Japan | 437/36 |
| 59-110169 | 6/1984 | Japan | 437/36 |
| 60-77460 | 5/1985 | Japan | 437/36 |
| 2-309663 | 12/1990 | Japan | 437/30 |

Primary Examiner—R. Bruce Breneman
Assistant Examiner—Ourmazd S. Ojan
Attorney, Agent, or Firm—Steven R. Biren

[57] ABSTRACT

A method of manufacturing a device, preferably a semiconductor device, whereby a mask (3) with an opening (4) extending down to a bare body (1) is provided on a surface (2) of this body (1), after which a substance (5) is implanted into the body (1) through the opening (4), upon which the mask (3) is removed. The mask (3) is provided by depositing a first and a second layer (6, 7, respectively) on the surface (2), and these layers are provided with the opening (4), while the first layer (6) can be selectively removed relative to the material of the body (1), and the second layer (7) is of the same material as the body (1). Since the same material is used for the second layer (7) as for the body (1), the body (1) is not polluted with material from the mask (3) in the opening (4) during implantation.

7 Claims, 3 Drawing Sheets

IMPLANTATION METHOD HAVING IMPROVED MATERIAL PURITY

BACKGROUND OF THE INVENTION

The invention relates to a method of manufacturing a device, preferably a semiconductor device, whereby a mask having an opening extending down to a bare body is provided on a surface of the body, after which a substance is implanted into the body through said opening, after which the mask is removed.

Such a method is particularly suitable for manufacturing semiconductor devices which, as transistors, are provided with buried conductor, semiconductor, or insulating layers. The substance then comprises, for example, Co, Ni, Ir, Fe, C, Y or O. Alternatively, for example, optoelectronic devices having optically active layers may be made by the method through the local implantation of ions of a rare earth metal into, for example, a glass body. The mask may comprise photoresist, silicon oxide, or, for example, a metal such as tungsten. The opening in the mask is made so as to reach down to the body, i.e. the body is bare in the opening, so that intermixing of any layer possibly present in the opening with the body during implantation is avoided.

A method of the kind mentioned in the opening paragraph is known from "Formation of Buried $CoSi_2$ by Ion Implantation" by K. Kohlhof et al. in Applied Surface Science 38 (1989), p. 207, whereby a silicon oxide mask is provided on a silicon semiconductor body. The opening is manufactured by lithographic techniques, whereby the silicon oxide is locally completely removed. A high dose of Co (approximately 3 $10^{17}$ ions.cm$^{-2}$) is implanted into the semiconductor body at an energy of 200 keV through the opening. The mask screens the surface of the semiconductor body outside the opening against implantation by Co. The semiconductor body is kept at a temperature of 350° C. during implantation in order to repair part of the damage caused by the implantation. The implanted Co is convened into $CoSi_2$, which can function as a buried conductor layer, after heat treatments at approximately 700° C. and 1,000° C.

The known method described has the disadvantage that the semiconductor body below the opening is not only implanted with the substance Co, but that the semiconductor body is also polluted, so that electrical and chemical properties of the semiconductor body change. For example, when the silicon oxide of the mask is removed by etching, the semiconductor body is also affected by the etching in the opening.

SUMMARY OF THE INVENTION

The invention has for its object inter alia to counteract the said disadvantage.

According to the invention, the method is for this purpose characterized in that the mask is provided through consecutive deposition on the surface of a first and a second layer and by providing these layers with the opening, while the first layer can be removed selectively relative to the material of the body and the second layer comprises the same material as the body.

The invention is based on the recognition that pollution of the body during implantation takes place with material of the mask. Energetic ions of the substance collide with the mask material, whereby part of this material evaporates. Material of the mask is then included in the body through the openings. Evaporation of mask material takes place in all implantations, but especially when ions are implanted in a comparatively high dose, i.e. a dose higher than approximately $10^{16}$ ions/cm$^2$. During the manufacture of a buried conductor layer, for example, pollution of the body with mask material readily takes place. In the known method, silicon oxide of the mask is evaporated by the cobalt ions, whereby oxygen enters the semiconductor body through the opening. Owing to the inclusion of oxygen, the semiconductor body has become sensitive to an etchant for silicon oxide. When the mask is removed with an etchant for silicon oxide, the semiconductor body itself is then attacked as well. The use of the same material for the body and for the second layer, according to the invention, achieves that no pollution of the body takes place with mask material. In fact, the second layer is made of the same material as the body. So no foreign material enters the body. The mask is provided to such a thickness that the ions cannot reach the body through the mask.

It is noted that a method is known from the Japanese Patent Application JP 2-303 168 for forming a buried electrode in a silicon body by means of a polysilicon mask. An oxide layer is present over the entire surface of the body, so in the opening and between the mask and the body. The implantations take place through the oxide layer and the mask, so that mixing of oxygen with the body takes place in the opening and below the mask.

During the method, the substance is also implanted into the mask. In the known method, the substance can diffuse into the body situated below the mask during a further heat treatment, where it constitutes an undesirable impurity. In the method according to the invention, practically no diffusion of implanted substance from the mask to the body takes place because the first layer also acts as a diffusion barrier. The first layer also provides a good adhesion between the second layer and the body and at the same time ensures that the mask can be removed without damage to the surface of the body. This may take place, for example, in that the mask is covered with photoresist, the photoresist is etched back until only the openings are filled with photoresist, the second and first layer are removed by a usual etching technique, after which the photoresist is removed. Preferably, however, the mask is removed by a lift-off technique through the removal of the first layer, because this can be selectively removed relative to the material of the body. Thus the mask can be removed in a simple manner without attacking the body.

The first layer is removed during the lift-off. Portions of the second layer, however, may adhere to the body during the lift-off, since the second layer comprises the same material as the body. These remnants may be removed, for example, by polishing. Preferably, however, remnants of the mask are removed in a bath which is vibrated megasonically after the lift-off. A quicker and better removal of the mask is achieved in this manner.

When the openings in the first layer and in the second layer are equally large, the first layer may become locally exposed in the case of implantations of long duration or high energy owing to evaporation of an edge of the second layer near the openings, so that material of the first layer also evaporates and pollutes the body. Preferably, the method according to the invention is characterized in that the first layer is provided with a greater opening than the second layer. The second layer will then completely overlap the first layer. No material of the first layer will become exposed near the opening when the edge of the second layer is evaporated, so that no pollution of the body with material of the first layer takes place. The opening in the first layer may be made greater than that in the second layer in a simple manner in that the first layer is underetched.

The mask is provided to such a thickness that the ions cannot reach the body through the mask. An average achievable penetration depth of the ions during implantation depends on the material into which they are implanted. In semiconductor materials, for example, a comparatively great penetration depth is possible. During implantation of such a body, according to the invention, the material of the second layer is also a semiconductor material, which means that a comparatively thick second layer must be provided to prevent ions entering the semiconductor body. Now it is difficult to provide openings with very fine details in comparatively thick layers. In such a case a first layer may be provided which can both be selectively removed relative to the body and has a small penetration depth for ions of the substance. Thus, for example, a comparatively heavy metal such as W may be taken for the first layer. Preferably, however, an intermediate layer of a material having a small penetration depth for ions of the substance is deposited after the deposition of the first layer, after which the second layer is deposited. The method then becomes more flexible. For example, a material may be taken for the first layer which forms a good diffusion barrier to the substance, but which does not necessarily have a small penetration depth for ions of the substance. A material is then deposited as an intermediate layer having a small penetration depth for the ions, so that a small layer thickness is required. The second layer again serves to counteract pollution caused by evaporation of mask material. The total thickness of the mask, especially in the case of implantations to a greater depth, may then be chosen to be smaller than would be the case without the intermediate layer, so that openings with very fine details can be provided in the mask.

When silicon is used as the material of the body, a glass, such as phosphorus silicate glass, or a metal, such as Ti or W may be used as the material for the first layer. An additional advantage is obtained when a first layer of silicon oxide or (oxy)nitride is deposited. A silicon oxide or (oxy)nitride layer may be deposited in a simple manner by usual techniques. In addition, etchants for silicon oxide and (oxy)nitride having a very good selectivity relative to silicon are available, while at the same time silicon oxide and (oxy)nitride can form a good diffusion barrier.

In the case of a silicon body, according to the invention, silicon is used as the material for the second layer. Preferably, a second layer of polycrystalline or amorphous silicon is deposited. Polycrystalline and morphus silicon can be provided in a very simple manner, for example, by deposition from the vapor phase (CVD).

BRIEF DESCRIPTION OF THE DRAWINGS

The invention will be explained in more detail below, by way of example, with reference to the drawing, in which.

The Figures are purely diagrammatic and not drawn to scale.

DESCRIPTION OF THE PREFERRED EMBODIMENTS

Figure 1:
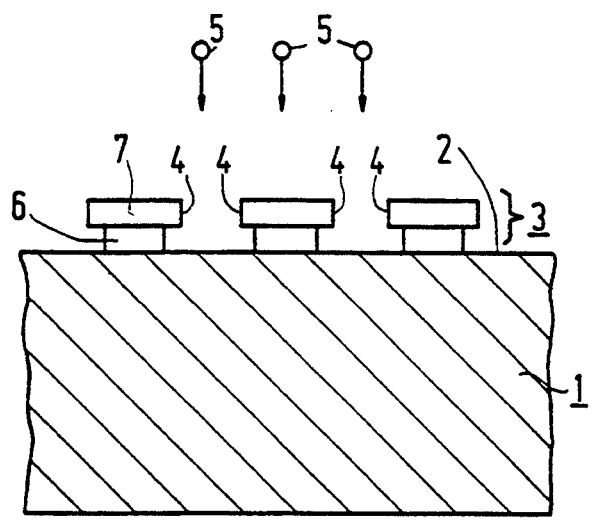
FIG. 1 shows a mask comprising a first and a second layer, provided by a method according to the invention.

FIG. 1 shows a method of manufacturing a device, preferably a semiconductor device, whereby a mask 3 comprising an opening 4 extending down to a body 1 is provided on a surface 2 of the body 1, after which a substance 5 is implanted into the body 1 through the opening 4, upon which the mask 3 is removed again. During implantation, ions of the substance 5 are formed, which ions are so accelerated in an electric field that their energy (20 keV–4 MeV) is sufficient for them to penetrate through the openings 4 into the body 1. The ions of the substance 5 are neutralized in the body 1. The implanted substance 5 is incorporated in the body 1 by means of a heat treatment. Damage to the body created by the implantation is also repaired during the heat treatment. It is true especially for the formation of buried layers that, when comparatively large doses (for example, more than $10^{16}$ cm$^{-2}$) of a substance 5 are implanted, the damage to the body 1 is so great that a heat treatment after implantation is insufficient for repairing all damage. In such a case, the body 1 is kept at an elevated temperature of between approximately 300° C. and 500° C. during implantation. Part of the damage may then be repaired during the implantation itself. Buried or surface layers may also be structurally better owing to the implantation being carried out at an elevated temperature. The body 1 may comprise, for example, silicon, germanium or a glass, the mask 3 may comprise, for example, photoresist, silicon oxide, or a metal such as tungsten. The mask 3 may be provided in that a layer is deposited on the surface 2 of the body 1. The openings 4 are formed in this layer by photolithographic techniques and usual etching processes. After implantation, the mask 3 is removed from the surface 2 in that the material of the mask 3 is etched away selectively relative to the material of the body 1.

Implantation is frequently used, especially in semiconductor technology, for locally providing dopants or for manufacturing buried conductor layers or insulators. A problem arises in practice since the body 1 is polluted during implantation and properties of the body are adversely affected.

According to the invention, the mask 3 is provided in that a first layer 6 and a second layer 7 are consecutively deposited on the surface 2, which layers are provided with the opening 4, while the first layer 6 can be removed selectively relative to the material of the body 1 and the second layer 7 comprises the same material as the body 1. The invention is based on the recognition that material of the mask 3 evaporates through contact with energetic ions of the substance 5. The material of the mask 3 evaporates especially when a comparatively high dose (for example, more than $10^{16}$ cm$^{-2}$) is implanted. The material of the mask 3 then pollutes the body 1 through the openings 4. Electrical properties such as conductance and chemical properties such as etchability of the body 1 may then change in an undesirable manner. In the method according to the invention, the layer with which the energetic ions come into contact is the second layer 7. This layer is made of the same material as the body 1. The material of the mask 3 which is evaporated by energetic ions of the substance 5 and which may possibly be incorporated in the body 1 is then the same material as that of the body 1 itself. Consequently, no pollution of the body with mask material takes place.

During implantation, the substance 5 is not only incorporated in the body 1 through the openings 4, but also in the mask 3. The mask 3 is provided to such a thickness that the ions cannot reach the surface 2 of the body 1 through the mask. During a heat treatment carried out during or after the implantation, however, the substance 5 is capable of diffusing from the mask 3 into the body 1. In the method according to the invention, the mask 3 is provided in that a first layer 6 and a second layer 7 are deposited. The first layer 6 acts as a diffusion barrier to the substance 5 implanted in the mask. The first layer 6, however, fulfils more functions. Thus this layer is also used inter alia as a bonding layer for the second layer 7, while the first layer 6 also serves to enable a selective removal of the mask 3 without attacking the surface 2 of the body. Materials which may be used for the first layer 6 are, for example, glasses or ceramic materials such as phosphorus silicate glass, oxides or nitrides, semiconductors such as silicon, or metals such as Ti or W. An exact choice of material for the first layer 6 may be made on the basis of known data about the degree of selectivity in etching of the first layer 6, about the degree to which the first layer 6 forms a diffusion barrier to the substance 5, and about the ease with which the first layer 6 is provided.

The mask 3 may be removed, for example, by covering the mask with photoresist, etching the photoresist back until only the openings 4 are filled with photoresist, and subsequently removing the second layer 7 and the first layer 6 by a usual etching technique, after which the photoresist is removed. Preferably, the mask 3 is removed by a lift-off technique through the removal of the first layer 6, since this layer can be selectively removed relative to the material of the body 1 according to the invention. The layer 6 may be removed in usual manner, for example, by a wet-chemical etching technique, whereby an etchant is used which selectively attacks the first layer 6, but does not affect the body 1. Thus the entire mask can be removed after use in a simple manner.

The first layer 6 is removed during the lift-off. Portions of the second layer 7, however, may adhere to the body 1 during the lift-off, after all this second layer 7 comprises the same material as the body 1. Preferably, remnants of the mask 3 are removed in a bath after the lift-off, the bath being vibrated megasonically. A quicker and better removal of the mask 3 is achieved in this manner.

The body 1 is implanted through the openings 4 in the first layer 6 and the second layer 7. Evaporation of the material of the second layer 7 may take place along an edge of the opening 4 in the case of long implantations. The material of the first layer 6 may then become exposed in such a location, after which material of the first layer 6 is also evaporated through contact with the ions of the substance 5. Since this material, in contrast to the material of the second layer 7, is different from the material of the body 1, this body 1 may become polluted. In the method according to the invention, the first layer 6 is provided with greater openings 4 than is the second layer 7, so that the second layer fully overlaps the first layer (see FIG. 1). No material of the first layer 6 will be exposed then when an edge of the second layer 7 near the openings 4 is evaporated, so that no pollution of the body 1 with material of the first layer 6 takes place. The openings 4 in the first layer 6 may be made greater than those in the second layer 7 in a simple manner through under-etching of the first layer 6, for example, with an isotropically etching wet-chemical etchant.

Figure 2:
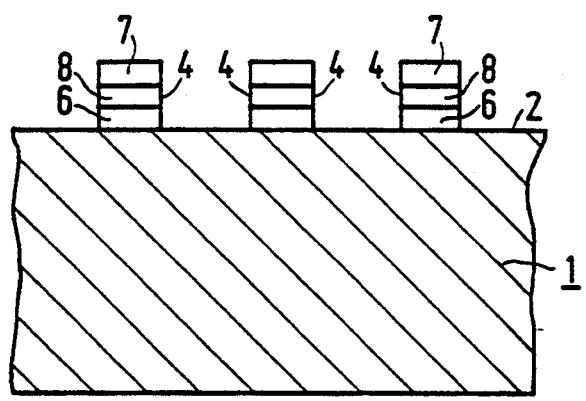
FIG. 2 shows a mask comprising an intermediate layer between the first and the second layer, provided by a method according to the invention.

When ions are implanted into a body or layer of a certain material, these ions have a certain penetration depth which depends on, among other factors, their atomic weight, acceleration energy, and the material into which implantation takes place. Penetration depth is understood to mean the distance between the location in the body or layer where the concentration of the implanted substance shows a maximum and the surface of the body or layer through which the ions have penetrated the body. A concentration distribution of the implanted substance may then be characterized in usual manner by a spread $\sigma$. Many of the materials usual in semiconductor technology, such as silicon, silicon oxide, silicon (oxy)nitride, but also the usual photoresists have comparable penetration depths for ions. The mask 3 is provided to such a thickness that the ions cannot reach the body 1 through the mask 3. Since the material of the second layer 7 is the same material as the material of the body, a comparatively thick mask 3 will be required, especially when comparatively deep implantations are required. Now it is difficult to provide openings 4 with very fine details in comparatively thick layers. In such a case, a first layer 6 may be provided which can be selectively removed relative to the body and which also has a small penetration depth for the ions of the substance 5. For example, a layer of a metal such as molybdenum or tungsten, or of a different metal which is not too light, may be taken for the first layer 6. Preferably, however, an intermediate layer 8 of a material having a small penetration depth for ions of the substance 5 is deposited after the deposition of the first layer 6, upon which the second layer 7 is deposited and the openings 4 are provided (see FIG. 2). The method becomes more flexible then. A material may be taken for the first layer 6, for example, which forms a good diffusion barrier to the substance 5 and to the intermediate layer 8, but which does not necessarily have a small penetration depth for ions of the substance 5. A material having a small penetration depth for the ions is then deposited as the intermediate layer 8, so that a small layer thickness is required. The second layer 7 again serves to counteract impurities caused by evaporation of mask material. The total thickness of the mask 3 may then be chosen to be smaller than without the intermediate layer 8, so that openings 4 with very fine details can be provided in the mask 3.

When a body 1 made of silicon is implanted, an advantage is obtained when a first layer 6 of silicon oxide or (oxy)nitride is deposited. A silicon oxide or (oxy)nitride layer can be deposited in a simple manner by usual techniques. In addition, etchants for silicon oxide and (oxy)nitride are available which show a very good selectivity relative to silicon, while at the same time silicon oxide and (oxy)nitride form a good diffusion barrier to many materials. According to the invention, silicon is then also used as the material for the second layer 7. Preferably, a second layer 7 of polycrystalline or amorphus silicon is deposited. Polycrystalline and amorphous silicon can be provided in a very simple manner by usual techniques, for example, through deposition from the vapor phase (CVD).

Embodiment 1: Implantation of a silicon semiconductor body with cobalt so as to form a buried layer for a "permeable base" transistor.

Figure 4:
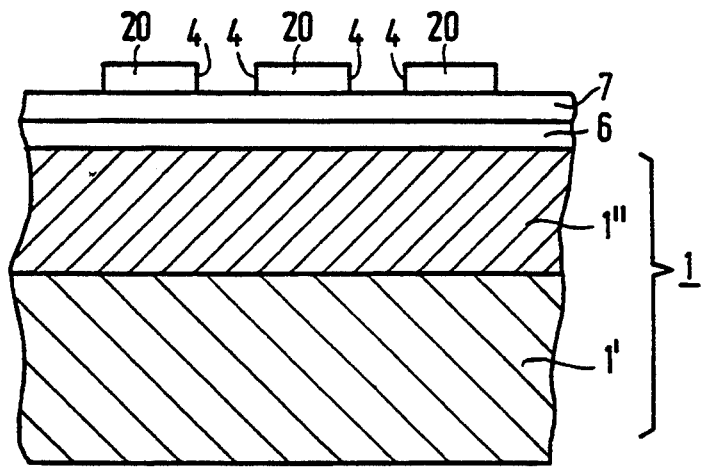
FIG. 4 shows a stage in the manufacture of a permeable base transistor.
Figure 3A:
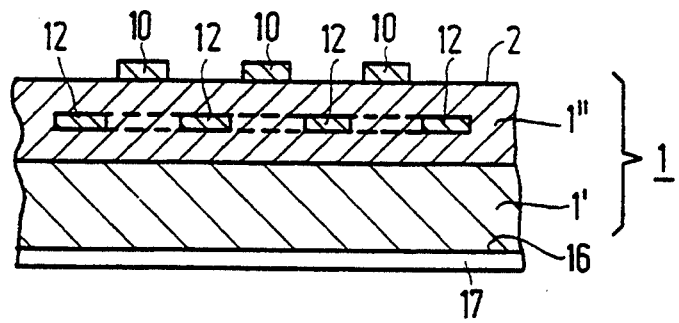
FIGS. 3a–c show a so-called permeable base transistor with a buried base layer manufactured by a method according to the invention.
Figure 3B:
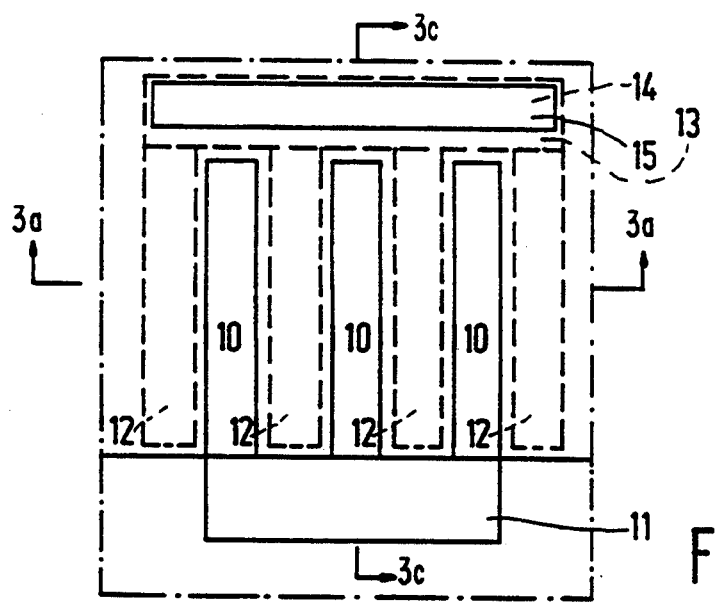
Figure 3C:
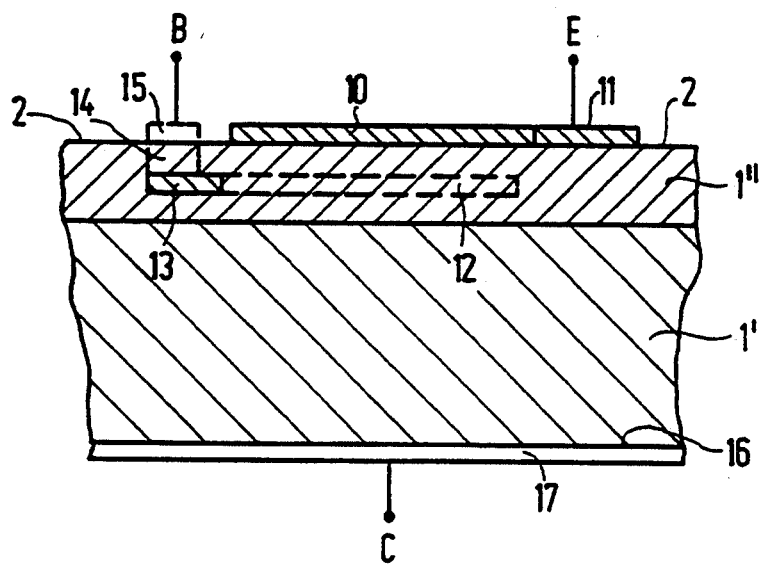

A permeable base transistor as outlined in FIG. 3 is manufactured by the method according to the invention. The Figure shows only one transistor for the sake of clarity, but in actual fact many transistors may be manufactured simultaneously in the semiconductor body 1. In FIG. 3, FIG. 3a is a cross-section taken on the line 3a—3a in FIG. 3b. FIG. 3b is a plan view of the transistor and FIG. 3c is a cross-section taken on the line 3c—3c in FIG. 3b. The permeable base transistor comprises a semiconductor body 1 built up from a highly doped n-type substrate 1' ($10^{18}$ cm$^{-3}$ As-doped) and a weakly doped n-type epitaxial layer 1" ($10^{15}$ cm$^{-3}$ P-doped). The emitter is present at the surface 2 and is formed by a conducting layer in the form of fingers 10 which are interconnected by a metal layer 11. At a certain depth below the surface 2 there are buried conductor layers 12 in the form of fingers, forming a base electrode. The fingers 12 of the base electrode are connected to a buried conductor layer 13. This buried conductor layer 13 has an electrical connection to the surface through a highly doped n-type region 14. The highly doped region 14 is provided with a conductor layer 15 at the surface 2. A metal layer 17, which acts as the collector, is provided at a rear side 16 of the semiconductor body 1. The permeable base transistor is manufactured by the method according to the invention in that a first layer 6 of 50 nm thermal silicon oxide is grown through oxidation in wet oxygen (see FIG. 4) on the surface 2 of the silicon semiconductor body 1 in usual manner. A second layer 7 of 450 nm polycrystalline silicon is provided in usual manner on the first layer 6 by a low-pressure deposition from the gas phase (LPCVD). The polycrystalline silicon of the second layer 7 is subsequently provided with a photoresist 20 which is provided with openings 4 by photolithographic techniques and an etching process. The openings 4 are then provided in the second layer 7 in a plasma etching process comprising chlorine. Such an etching process etches polycrystalline silicon selectively relative to silicon oxide. Then the openings 4 in the first layer of silicon oxide 6 are etched in a reactive plasma etching process comprising carbon fluoride (CF$_4$) and hydrogen. This etching process is highly selective relative to silicon, so that only the first layer and not the semiconductor body 1 is attacked by the etchant. To make the openings 4 in the first layer 6 somewhat larger than the openings 4 in the second layer 7, the silicon oxide of the first layer 6 is lightly etched in an HF solution buffered with ammonium fluoride (1:7). The photoresist is then removed. FIG. 1 shows that the mask 3 provided with the openings 4 is then present at the surface 2 of the semiconductor body 1. Cobalt, i.e. the substance 5, is then implanted through the openings 4 at an energy of 400 keV up to a dose of $3.10^{17}$ cm$^{-2}$ in order to form the buried conductor layers 12 and 13 for the base electrode. During the implantation the semiconductor body 1 is kept at a temperature of 450° C. so as to repair partly the damage caused during the implantation. Then the damage caused during implantation is repaired in two stages and the implanted cobalt is converted to highly-conductive buried layers 12 and 13 of cobalt silicide. During the first stage, the semiconductor body 1 receives a heat treatment for one hour at 600° C., a so-called "pre-anneal". During the second stage, a heat treatment at 1,000° C. for 30 minutes is carried out. After the second stage an approximately 100 nm thick cobalt silicide layer 12 and 13 has been formed at a depth of approximately 300 nm. Then the mask, which comprises the first layer 6 and the second layer 7, is removed through the removal of the first layer 6. To this end, the semiconductor body is introduced into a solution of HF (1:7) buffered with ammonium fluoride. The silicon oxide of the first layer is dissolved in this solution, so that the first layer 6 and the second layer 7 are removed from the surface 2. To remove any remaining mask portions, the semiconductor body is then megasonically vibrated in a solution of H$_2$O$_2$/NH$_3$/H$_2$O (1:1:5). The surface 2 of the semiconductor body 1 is not attacked then. During the implantation no pollution of the semiconductor body 1 with material of the mask has taken place. Subsequently, the highly doped region 14 is formed in usual manner through, for example, a deep diffusion with P and the buried conductor layer 13 of the base electrode is connected to the surface 2. Then a metal layer, for example, cobalt is deposited on the surface 2 in usual manner, for example, by a sputtering process and this layer is patterned, whereby the emitter fingers 10 and the conducting layers 11 and 15 are formed. The rear side 16 of the semiconductor body is then provided with a metal layer 17, for example, an aluminum layer. The permeable base transistor thus created can be manufactured without short-circuiting between emitter and base taking place owing to etching attacks on the surface. The transistor manufactured has very good high-frequency characteristics.

Embodiment 2: Implantation of a silicon semiconductor body with nickel so as to manufacture a buried layer for a bipolar power transistor.

Figure 5:
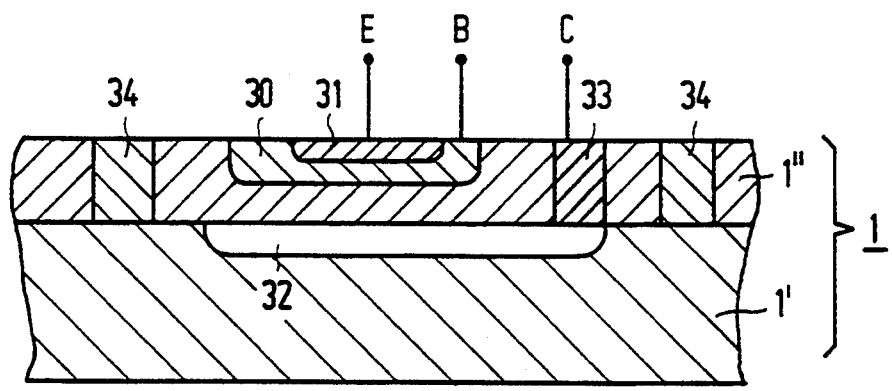
FIG. 5 shows a power transistor comprising a buried conductor layer provided by a method according to the invention.
Figure 6:
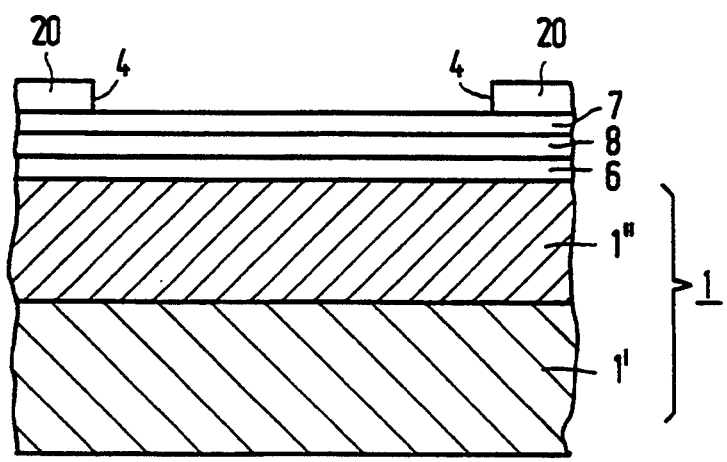
FIG. 6 shows a stage in the manufacture of a power transistor comprising a buried conductor layer.

A cross-section of a bipolar power transistor is diagrammatically shown in FIG. 5. The Fig. shows only one transistor for the sake of clarity, but in actual fact many transistors may be manufactured simultaneously in the semiconductor body. The power transistor of the NPN type comprises a semiconductor body 1 constructed from a p-type doped substrate 1' and a weakly doped epitaxial n-type doped layer 1" with a thickness of 11 μm. The p-type doped region 30 and the highly doped n-type region 31 are present in the epitaxial layer. The regions 30 and 31 act as the base and emitter regions of the transistor, respectively. At some depth below the surface 2 there is a buried conductor layer 32 which provides a low-ohmic connection to the collector. The conductor layer 32 has an electrical connection to the surface 2 through a highly doped n-type region 33. The highly doped p-type regions 34 serve to insulate the transistor. The power transistor is manufactured by the method according to the invention. To this end, a 50 nm thick first layer 6 of silicon nitride is deposited on the surface 2 of the semiconductor body 1 (see FIG. 6) by means of low-pressure chemical vapor deposition (LPCVD). A 0.5 μm thick tungsten intermediate layer 8 is deposited on the first layer 6 by a usual CVD process from a mixture of $WF_6$ and $H_2$. A second layer 7 of 200 nm polycrystalline silicon is provided on this intermediate layer 8 in usual manner by low-pressure deposition from the gas phase (LPCVD). The polycrystalline silicon of the second layer 7 is then provided with a photoresist 20 which is given an opening 4 by photolithographic techniques and an etching process. The opening 4 is then provided in the second layer 7 in a plasma etching process comprising chlorine. The opening 4 in the tungsten intermediate layer 8 may be etched by means of a usual etching process with $CF_4$. Then the opening 4 is etched in the silicon nitride first layer 6 in a reactive plasma etching process comprising $CH_2F_2$. Nickel is then implanted as the substance 5 through the opening 4 at an energy of 2 MeV in a dose of $3.10^{17}$ cm$^{-2}$ in order to form the buried conductor layer 32 for the collector connection. The semiconductor body 1 is kept at a temperature of 400° C. during the implantation in order to partly repair the damage done during the implantation. Then the damage caused during the implantation is repaired in two stages and the implanted nickel is converted to the highly-conductive buried layer 32 of nickel silicide. In the first stage, the semiconductor body 1 receives a heat treatment for one hour at 600° C., a so-called pre-anneal. In the second stage, a heat treatment at 1.000° C. is carried out for 30 minutes. After the second stage, an approximately 150 nm thick nickel silicide layer 32 has been formed at a depth of approximately 1 $\mu$m. Then the mask comprising the first layer 6, the intermediate layer 8 and the second layer 7 is removed through the removal of the first layer 6. To this end, the body is introduced into a solution of $H_3PO_4$. The silicon nitride of the first layer 6 is dissolved in this solution, whereby the first layer 6 as well as the intermediate layer 8 and the second layer 7 are removed from the surface 2 by a lift-off process. Remnants of the mask are eliminated in that the body is megasonically vibrated in a bath containing $H_2O_2/NH_3/H_2O$ (1:1:5). During implantation, no pollution of the body 1 with material of the mask has taken place. Subsequently, the regions 30, 31, 33 and 34 are manufactured in usual manner through diffusion of n- and p-type dopants. The emitter, base and collector regions are contacted by means of usual metal layers (not shown). The power transistor thus manufactured has very good characteristics. Thus the internal resistance of the collector is low and the transistor is capable of switching high powers.

Embodiment 3: Implantation of a silica glass body with erbium for the manufacture of a fluorescent layer for an optical device.

A 750 nm thick first layer 6 of silicon nitride is provided on a surface 2 of a body 1 of silica glass (amorphus silicon oxide) by means of an LPCVD process (see FIG. 1). A second layer 7 of 1.0 $\mu$m silicon oxide is provided on the first layer 6 through deposition from a tetraethoxy silane vapor (TEOS). The silicon oxide of the second layer 7 is subsequently provided with a photoresist which is given openings 4 by means of photolithographic techniques and an etching process. The second layer is provided with the openings 4 in a reactive plasma etching process comprising carbon fluoride ($CF_4$) and hydrogen. Then the openings 4 are etched into the first layer 6 of silicon nitride in a plasma etching process comprising $CH_2F_2$. This etching process is selective relative to silica, so that the first layer only and not the body 1 is etched. The photoresist is then removed. Subsequently, erbium is implanted as the substance 5 through the openings 4 at an energy of 3.5 MeV (Er++ ions) in a dose of $5\times10^{15}$ cm$^{-2}$. The body 1 is kept at room temperature during the implantation. The damage caused during implantation is repaired in a standard furnace at a pressure of $10^{-6}$ Torr and a temperature of 900° C. during one hour. The implanted erbium is then present in a layer of approximately 0,5 $\mu$m thickness and a depth of approximately 1.25 $\mu$m below the surface 2. Then the mask comprising the first layer 6 and the second layer 7 is removed through the removal of the first layer 6. The body is introduced into a solution of $H_3PO_4$ for this purpose. The silicon nitride of the first layer 6 is dissolved in this solution, whereby both the first layer 6 and the second layer 7 are removed from the surface 2. No pollution of the body 1 with mask material has occurred during the implantation. The erbium layer exhibits strong fluorescence properties at a wavelength of 1.54 $\mu$m. Such a layer may be used in the construction of, for example, lasers and waveguides in optoelectronic technology.

It is noted that the substance may aim be implanted into a layer on a substrate. Thus, in the third embodiment, erbium may alternatively be implanted into, for example, a 10 $\mu$m thick silica glass layer on a silicon substrate. It is obvious that in such a case the expression "material of the body" should be read as "material of the layer".

The invention is not limited to the embodiments described above. The method according to the invention may be used whenever a very low pollution level the semiconductor body by the mask is desired during an implantation of a body.

We claim:

1. A method of manufacturing a device, in which a mask having an opening extending down to a bare body is provided on a surface of the body, after which a substance is implanted into the body through said opening, after which the mask is removed, characterized in that the mask is provided through consecutive deposition on the surface of a first and a second layer and by providing these layers with the opening, the first layer being selectively removable relative to the material of the body and the second layer comprising the same material as the body.

2. A method as claimed in claim 1, characterized in that the mask is removed by a lift-off technique by the removal of the first layer.

3. A method as claimed in claim 2, characterized in that remnants of the mask are removed in a megasonically vibrated bath after the lift-off.

4. A method as claimed in claim 1 characterized in that the first layer is provided with a greater opening than the second layer.

5. A method as claimed in claim 1 characterized in that an intermediate layer of a material having a small penetration depth for ions of the substance is deposited in the first layer, after which the second layer is deposited on the intermediate layer.

6. A method as claimed in claim 1, wherein the body comprises silicon, characterized in that the first layer comprises one of silicon oxide and (oxy)nitride.

7. A method as claimed in claim 6, characterized in that the second layer comprises one of polycrystalline and amorphus silicon.

* * * * *